United States Patent [19]

Narikiyo et al.

[11] 4,203,224
[45] May 20, 1980

[54] INSERTION SPACE CHECKING JIG FOR ELECTRONIC COMPONENTS

[75] Inventors: Kazuhiko Narikiyo, Neyagawa; Eiji Itemadani, Sakai; Yoshinobu Maeda, Katano, all of Japan

[73] Assignee: Matsushita Electric Industrial Co., Ltd., Kadoma, Japan

[21] Appl. No.: 971,213

[22] Filed: Dec. 20, 1978

[30] Foreign Application Priority Data

Dec. 27, 1977 [JP] Japan .................... 52/177313[U]

[51] Int. Cl.$^2$ .................................... G01B 5/14
[52] U.S. Cl. .......................... 33/149 R; 33/180 R
[58] Field of Search ............ 33/149 R, 148 R, 148 E, 33/148 F, 150, 143 R, 180 R, 181 R, 174 R, 178 R

[56] References Cited

U.S. PATENT DOCUMENTS

| 1,238,440 | 8/1917 | Running | 33/150 |
| 1,921,997 | 8/1933 | Bliss | 33/148 E |

Primary Examiner—Willis Little
Attorney, Agent, or Firm—Cushman, Darby & Cushman

[57] ABSTRACT

A jig for checking space for machine insertion of electronic components with parallel lead wires on a printed substrate, comprising:

a pair of space detection levers 11,11' at the lower part, a pair of component-holding levers 10,10' at the upper part, the detection levers 11,11' and the holding levers 10,10' being opposite ends of crosswisely disposed levers 7,7 pivotted at middle parts thereof by pivotting pins 9,9' on a frame 1, so that, when an electronic component 3 is held by the part holding levers 10,10', the outside of the detection levers indicates a size of space necessary for inserting operation of an insertion head of a machine, and a pair of guide pins 2,2 fixed on a narrowed bottom face of a below extended member 101 of the frame 1;

a space checking is made by holding the electronic component 3 with and between the component-holding levers 10,10' and by inserting the guide pins 2,2 into insertion holes for lead wires of a printed substrate.

4 Claims, 2 Drawing Figures

INSERTION SPACE CHECKING JIG FOR ELECTRONIC COMPONENTS

BACKGROUND OF THE INVENTION

1. Field of the Technology

This invention relates to an insertion space checking jig for electronic components for use for checking insertion spaces on a designed or a trial-manufactured printed substrate on which electronics parts are to be inserted by an automatic insertion machine. The jig in accordance with the present invention affords a speedy and easy checking of feasibilities of the insertion spaces for automatic insertion of the electronic parts.

2. Background

Conventionally, in designing a printed substrate, location of holes for inserting electronic components such as resistors, capacitors, inductors, oscillation elements, thermistors, diodes or the like are determined by calculating with data of sizes and shapes and position of lead wires of components. However, such calculation takes a great long time and troubles and has a possibility of miscalculations; furthermore, even in such case as theoretical calculation shows the automatic insertion without touching other electronic components possible, in actual insertion process the insertion head of the automatic inserting machine sometimes happens to touch other electronic components due to errors of size and shape of the electronic components or bendings of the lead wires, thereby resulting in destroying said other components or failing to inserting desired electronic parts. Therefore, a suitable jig for easy space checking has been waited for. However since there are many sizes and shapes of the electronic components, there has not yet been proposed a jig suitable for use for various electronic components of different sizes and shapes.

SUMMARY OF THE INVENTION

The present invention purports to provide an insertion space checking jig for electronic components which have simple construction but a practical advantage of easy utility for electronic components of various sizes and shapes.

DETAILED DESCRIPTION OF THE PREFERRED EMBODIMENT

The insertion space checking jig of the present invention is for application to electronic components with two parallel lead wires protruded on the same side thereof, and the jig comprises:

a frame having a below extended member with two parallel guide pins on its bottom face with a specified gap between each other, and having on its top part a reference plate 6 with two holes 6',6' with the same gap as the said gap for inserting the lead wires therein, a pair of levers pivotted on said frame in a crosswise relation with each other, upper ends of the levers forming a pair of detection levers, respectively.

Figure 1:
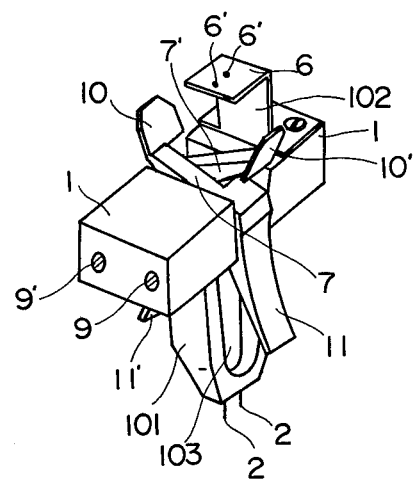
FIG. 1 is a perspective view of an insertion space checking jig for electronic components in accordance with the present invention shown with ends of their levers 7, 7' open.
Figure 2:
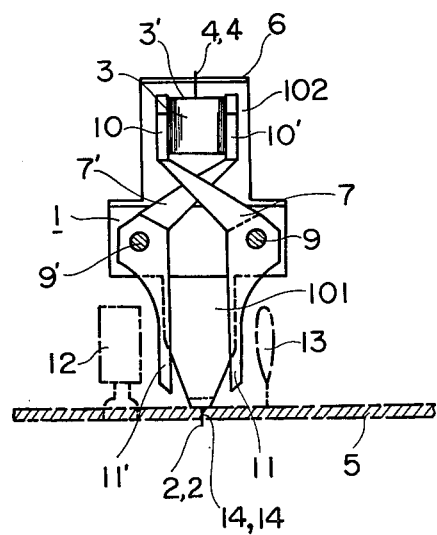
FIG. 2 shows a cross-section of the insertion space checking jig for electronic components in accordance with the present invention of FIG. 1 shown with an electronic part 3 held between their holding levers (10,&10').

A preferred embodiment of the jig in accordance with the present invention is elucidated hereinafter referring to FIG. 1 showing a perspective view thereof shown with ends of their levers 7,7' open, and FIG. 2 showing a sectional elevation view shown with an electronic part 3 held between their holding levers 10,10'.

As shown in these figures, a frame 1 has a below extended member 101 and an upper extended member 102. The below extended member 101 is tapered toward its lower and components and has a slot 103. On the bottom face of the below extended member 101 is downwardly embeded a pair of pins 2,2. The gap between a pair of the pins 2,2 is selected to be same with that of the parallel lead wires 4,4 of electronic components to be inserted on the printed substrate 5. The upper end of the upper extended member 102 is bent to form a reference plate 6 having a pair of through holes 6',6' with the same gap between each other as that of the pins 2,2 between each other for accepting lead wires 4,4 when holding an electronic components. In the slot 103 of the frame are pivotted a pair of levers 7,7' by a pair of pivotting pins 9,9' respectively. The pins 9,9' are situated substantially at a midway part between the lower face of the reference plate 6 and the bottom face of the below extended member 101. Two levers 7,7' are crosswisely situated with each other in a manner that the gap between the lower ends 11,11' of the levers 7,7' becomes almost equal to that of the upper ends 10,10' of the levers 7,7 for various sizes of the electronic part 3 held between the latter ends. The upper ends of the levers 7,7 form holding levers 10,10' between which an electronic part 3 is to be held as shown in FIG. 2, and their lower ends form detection levers 11,11' with which the space for insertion of the electronic part 3 is measured. The shape and sizes (thickness and depth) of the detection levers 11,11' are selected so as to simulate those of an insertion head of an automatic insertion machine.

The way of using the abovementioned insertion space checking jig is elucidated hereafter.

First, a pair of parallel lead wires 4,4 of an electronic part 3 are put through the holes 6',6' of the reference plate 6, and the electronic part 3 is held between the holding levers 10,10' as shown in FIG. 2. In such holding of the electronic component 3 by the holding levers 10,10', such a care should be taken that the gap between the upper face 3' of the electronic component 3 and the lower face of the reference plate 6 becomes to be that between the lower face of the same electronic component 3 and the upper face of a printed substrate when such electronic component 3 is to be inserted by an automatic insertion machine. By such holding of the electronic part 3 between the holding lever 10,10', the detecting lever 11,11' are automatically disposed in a manner to indicate, together with the below extended member 101, a simulated outside size and shape of the automatic insertion head when it holds the same electronic component 3.

Then, while holding the electronic component 3, the jig is put down into a space to be examined on a printed substrate 5 until the pins 2,2 at the bottom face of the below extended member 101 are inserted into holes 14,14 of the printed substrate 5. When putting down the jig on the trially manufactured printed substrate and inserting the pins 2,2 into the through holes 14,14, it should be examined that the detection levers 11,11' or the below extended member 101 does not touch any other electronic parts 12,13, which are already mounted on the printed substrate. If any of the detection levers or the below extended part touch any of the electronic parts 12,13 on the printed substrate, then the designer should know that he must change or modify the dispositions of the holes and of the electronic components. On the contrary, if there is too much room around the detection levers 11,11', then the designer should know that he may modify the disposition of the holes and of parts so that the completed printed circuit becomes more compact.

It is an important feature of the present jig that the pivotting pins 9 and 9' are located substantially at a middle position, and preferably at the center, between the lower face of the reference plate 6 and the bottom face of the below-extended member 101, and that the detection levers 11,11' have shapes and thickness similar to the insertion head. Because of such positioning of the pivotting pins 9,9', the gap between the pair of detection levers 11,11' becomes substantially equal to that of the outer size of the electronic parts 3 held between the holding levers 10,10'. And because of the abovementioned design of the shape and thickness of the detection levers 11,11', the jig in accordance with the present invention indicates a simulated outside shape and size of the insertion head of an automatic insertion machine irrespective of varieties of sizes of the electronic components. Therefore, the jig of the present invention is applicable to various sizes of electronic components, whenever they have parallelly disposed lead wires.

Moreover, since two levers 7,7' are formed in crank shape and is pivotted by two different pins 9,9', their detection lever parts satisfactorily simulate the insertion head even though the size of the components varies.

What is claimed is:

1. An insertion space checking jig for electronic components with two parallel lead wires, comprising
    a frame having a below extended member with two parallel guide pins on its bottom face with a specified gap between each other and having on its top part a reference plate with two holes with the same gap as the said specified gap for inserting the lead wires therein,
    a pair of levers pivotted on said frame in a crosswise relation with each other, upper ends of the levers forming a pair of holding levers for holding the electronic components and lower ends of the levers forming a pair of detection levers, respectively.

2. An insertion space checking jig for electronic components in accordance with claim 1, wherein said levers are pivotted at substantially midway part between the lower face of said reference plate and the bottom face of said below extended member.

3. An insertion space checking jig for electronic components in accordance with claim 1, wherein said detection levers are shaped similar to the corresponding part of an insertion head of an automatic insertion machine.

4. An insertion space checking jig for electronic parts in accordance with claim 1, wherein said levers are formed in crank shape and are pivotted by different pins located with a specified distance.

* * * * *